United States Patent [19]

Imai et al.

[11] Patent Number: 5,302,535

[45] Date of Patent: Apr. 12, 1994

[54] METHOD OF MANUFACTURING HIGH SPEED BIPOLAR TRANSISTOR

[75] Inventors: Kiyotaka Imai; Hiroshi Hirabayashi, both of Tokyo, Japan

[73] Assignee: NEC Corporation, Japan

[21] Appl. No.: 947,257

[22] Filed: Sep. 18, 1992

[30] Foreign Application Priority Data

Sep. 20, 1991 [JP] Japan .................. 3-240692
Sep. 27, 1991 [JP] Japan .................. 3-248689

[51] Int. Cl.⁵ .................... H01L 21/265; H01L 29/70
[52] U.S. Cl. ............... 437/31; 148/DIG. 11; 257/592
[58] Field of Search ............. 437/31; 148/DIG. 11; 257/592

[56] References Cited

U.S. PATENT DOCUMENTS 4,693,782 9/1987 Kikachi et al. .................. 437/31

FOREIGN PATENT DOCUMENTS

| 0286117 | 10/1988 | European Pat. Off. ....... 257/592 |
| 6464258 | 3/1989 | Japan . |
| 1144679 | 6/1989 | Japan . |
| 1246874 | 10/1989 | Japan .................. 257/592 |
| 0244636 | 9/1990 | Japan .................. 437/31 |
| 0304931 | 12/1990 | Japan .................. 437/31 |
| 3138948 | 6/1991 | Japan .................. 437/31 |

*Primary Examiner*—Olik Chaudhuri
*Assistant Examiner*—Long Pham
*Attorney, Agent, or Firm*—Laff, Whitesel, Conte & Saret

[57] ABSTRACT

In a method for manufacturing a bipolar transistor with the SST structure in which a P-type base region consists of a P+-type extrinsic base region, a P-type link base region and a P-type intrinsic base region, a silicon oxide film, for example, is formed in advance in a formation region of the P-type link base region and the P-type intrinsic base region on the surface of an N-type epitaxial layer, and a P+-type polycrystalline silicon film and a silicon nitride film that cover at least the formation region of the P-type base region are formed. An emitter opening surrounded by a gap part and a base lead-out electrode consisting of the P+-type polycrystalline silicon film are formed. A P+-type extrinsic base region and a P-type intrinsic base region are formed by applying heat treatment after forming a BSG film on the surface so as to fill in the gap part. A spacer consisting of the BSG film is formed on the side face of the emitter opening, and an emitter lead-out electrode consisting of the N+-type polycrystalline silicon film is formed. By applying a heat treatment again, a P-type link base region and an N+-type emitter region are formed.

11 Claims, 6 Drawing Sheets

METHOD OF MANUFACTURING HIGH SPEED BIPOLAR TRANSISTOR

BACKGROUND OF THE INVENTION

1. Field of the Invention

The present invention relates to a method of manufacturing a semiconductor device, and more particularly to a method of manufacturing a high speed bipolar transistor having super self-aligned process technology (SST) structure.

2. Description of the Prior Art

A bipolar transistor having the SST structure designed for increasing the operating speed of a vertical bipolar transistor has been put to practical use. An NPN bipolar transistor with this structure can be formed as described in the following. First, an N-type epitaxial layer which is made selectively into a collector region and a device isolation region are formed on the surface of a P-type silicon substrate. Following that, a P+-type polycrystalline silicon film is formed allover the surface, and a base lead-out electrode and an emitter opening consisting of P+-type polycrystalline film are formed by etching the P+-type polycrystalline film. Next, a P+-type extrinsic base region is formed on the surface of the N-type epitaxial layer in self-aligned manner with respect to the base lead-out electrode, and a P-type intrinsic base region of the N-type epitaxial layer is formed in self-aligned manner with respect to the emitter opening. A spacer consisting of an insulating film is formed on the side face of the emitter opening. Then, an emitter lead-out electrode consisting of an N+-type polycrystalline silicon film is formed in the form of buried in the emitter opening, and an N+-type emitter region is formed on the surface of the P-type intrinsic base region in self-aligned manner with respect to the emitter lead-out electrode. This bipolar transistor is realizing high operating speed by reducing the parasitic base resistance and the parasitic base capacitance.

In order to further increase the operating speed of the bipolar transistor of this structure two technical issues have to be solved. A first issue is that it is difficult to further reduce the parasitic base resistance due to the presence of the high resistance P-type intrinsic base region between the N+-type emitter region and the P+-type extrinsic base region. A second issue is that degradation in the breakdown voltage of the emitter region, increase in the leakage current, fluctuation of the current amplification factor ($h_{FE}$) or the like, for example, become liable to occur, caused by the etching of the P+-type polycrystalline silicon film for the formation of the emitter opening.

In accordance with Japanese Laid-Open Patent Application No. 1-144679 (laid open on Jun. 6, 1989) by the present applicant, the aforementioned first issue can be settled by providing a P-type link base region which connects the two regions of N+-type emitter region and the P+-type extrinsic base region in the fabrication of a bipolar transistor of the above-mentioned structure. The impurity concentration of the P-type link base region is lower than the impurity concentration of the P+-type extrinsic base region, and is higher than the impurity concentration of the P-type intrinsic base region. The P-type link base region is realized by forming a spacer consisting of a BSG film on the side face of the emitter opening and inducing diffusion of boron from the spacer.

However, the second issue cannot be settled by the fabrication method disclosed in the aforementioned provisional publication. The reasons for this are as follows. In the region where the emitter opening is formed, the P+-type polycrystalline silicon film is brought into direct contact with the N-type epitaxial layer. Because of this, it is very difficult in the etching (this being a dry etching such as RIE which is highly anisotropic) of the P+-type polycrystalline silicon film for the formation of the emitter opening to stop the etching at the interface of the P+-type polycrystalline silicon film and the N-type epitaxial layer. As a result, the surface of the N+-type epitaxial layer where the emitter region is formed is roughened by the removal of the surface by etching, causing deterioration of the breakdown voltage of the emitter region, increase in the leakage current, fluctuation of the current amplification factor ($h_{FE}$) or the like. It should be mentioned that even if the above-mentioned etching is done in wet mode (isotropic etching), roughening due to scraping of the N-type epitaxial layer where the emitter region is formed is inevitable. In particular, fine emitter opening can no longer be obtained in this case because of the side etching of the P+-type polycrystalline silicon film.

The second issue can be settled to a certain extent by the fabrication method of bipolar transistor disclosed in Japanese Patent Application Laid-Open No. 64-64258 (laid open on Mar. 10, 1989). This fabrication method is as described below.

First, a field oxide film is formed selectively on the surface of an N-type silicon substrate excluding at least the region where a P+-type extrinsic base region and the region where a base region consisting of a P-type intrinsic base region. Next, on the surface of the region of the N-type silicon substrate where the P-type intrinsic base region is formed a masking material consisting of a first silicon oxide film of thickness of about 50 nm is formed. Next, an undoped polycrystalline silicon film and a solid phase diffused material consisting of, for example, a BSG film (with boron concentration of about $1 \times 10^{20}$ cm$^{-3}$) are deposited in sequence allover the surface. Following that, a P+-type extrinsic base region (with junction depth of about 0.5 μm) and a P-type intrinsic base region (with junction depth of about 0.3 μm) are formed by annealing at 950° C. for 30 min. As a result of the annealing, the undoped polycrystalline silicon film is converted to a P+-type polycrystalline silicon film. Next, after removal of the solid phase diffused material an interlayer insulating film consisting of a second silicon oxide film is formed allover the surface.

Next, the interlayer insulating film and the P+-type polycrystalline silicon film are etched in sequence by a two stage RIE that uses that uses photoresist films, a base lead-out electrode consisting of a P+-type polycrystalline silicon film is formed, and at the same time a window is formed in the region where an emitter opening is to be formed. Since the masking material functions as a stopper in the etching of the P+-type polycrystalline silicon film, the surface of the N-type silicon substrate will not be exposed to this etching, and the generation of faults, contamination, damages or the like in this part can be avoided.

Next, a third silicon oxide film is deposited allover the surface. Following that, the silicon oxide film is etched back by an RIE, and an emitter opening having the silicon oxide film as a spacer is formed. Next, an emitter lead-out electrode consisting of an N+-type polycrystalline silicon film is formed, and an N+-type emitter region is formed by heat treatment. Following that, an opening formed in the interlayer insulating film, and a base electrode is formed.

According to this fabrication method, a P-type intrinsic base region is formed by boron from the BSG film which passed the polycrystalline silicon film and the mask material. Because of this, when the impurity concentration of the P-type intrinsic base region is high, the parasitic base resistance can be reduced but the base width is increased (in other words, the junction depth of the P-type intrinsic base region becomes large) and the cut-off frequency ($f_T$) cannot be raised so that the method is not suitable for increasing the operating speed. On the other hand, when the impurity concentration of the P-type intrinsic base region is low, the parasitic base resistance cannot be reduced, and the aforementioned first issue cannot be settled.

BRIEF SUMMARY OF THE INVENTION

Objects of the Invention

It is an object of the invention to provide a method of manufacturing a bipolar transistor having the SST structure which is suited for increasing the operating speed.

It is an object of the invention to provide a method of manufacturing an NPN bipolar transistor having the SST structure which is suited for increasing the operating speed by reducing the parasitic base resistance.

It is an object of the invention to provide a method of manufacturing an NPN bipolar transistor having the SST structure which is suited for increasing the operating speed by preventing the deterioration in the breakdown voltage of the emitter region, increase in the leakage current and fluctuation of the current amplification factor ($h_{FE}$).

It is an object of the invention to provide a method of manufacturing an NPN bipolar transistor having the SST structure which is suited for increasing the operating speed by preventing the deterioration in the breakdown voltage of the emitter region, increase in the leakage current and fluctuation of the amplification factor ($h_{FE}$) through reduction of the parasitic base resistance.

It is an object of the invention to provide a method of manufacturing a semiconductor device having an NPN bipolar transistor of the SST structure which is suited for increasing the operating speed.

It is an object of the invention to provide a method of manufacturing a semiconductor device having an NPN bipolar transistor of the SST structure which is suited for increasing the operating speed by reducing the parasitic base resistance.

It is an object of the invention to provide a method of manufacturing a semiconductor device having an NPN bipolar transistor which has a high breakdown voltage of the emitter region, small leakage current, small fluctuation of the current amplification factor ($h_{FE}$), and has the SST structure which is suited for increasing the operating speed.

It is an object of the invention to provide a method of manufacturing a semiconductor device having an NPN bipolar transistor with the SST structure suited for increasing the operating speed, and has low parasitic base resistance, high breakdown voltage of the emitter region, small leakage current and small fluctuation of the current amplification factor ($h_{FE}$).

SUMMARY OF THE INVENTION

A first mode of the method of manufacturing a semiconductor device according to this invention includes a process of forming on the surface of a silicon substrate an element isolation region which partitions at least an N-type region which will become the collector region of an NPN bipolar transistor and at least a region where the base region of the NPN bipolar transistor is to be formed, a process of selectively forming a first BSG film on a region of the N-type region where a P-type link base region and a P-type intrinsic base region of the NPN bipolar transistor are to be formed, a process of forming a P+-type polycrystalline silicon film containing boron at a concentration higher than that of the first BSG film in a region which covers at least the region where the base region is to be formed, and forming by a CVD method a silicon nitride film which covers at least the top face of the P+-type polycrystalline film, a process of forming, by sequentially etching by means of methods including at least anisotropic etching the silicon nitride film, the P+-type polycrystalline silicon film and the first BSG film, an emitter opening and a base lead-out electrode consisting of the P+-type polycrystalline film, and residually forming a first BSG film having the form of encircling the circumference of the emitter opening, a process of forming allover the surface a second BSG film which contains boron at a concentration lower than that of the first BSG film, a process of forming by a first heat treatment a P+-type existrinsic base region in self-alignment with the base lead-out electrode, a P-type link base region in self-alignment with the residually formed first BSG film and a P-type intrinsic base region in self-alignment with the second BSG film in the region of formation of the base region, a process of forming a spacer consisting of the second BSG film on the side face of the emitter opening by an etching method including anisotropic etching, a process of forming an emitter lead-out electrode consisting of an N+-type polycrystalline silicon film having the form of burying the emitter opening, and a process of forming by a second heat treatment an N+-type emitter region in self-alignment with the emitter lead-out electroce in the P-type intrinsic base region.

Preferably, the CVD method for forming the silicon nitride film is carried out at a high temperature, the etching of the first BSG film in the formation of the emitter opening includes at least wet etching that uses diluted hydrofluoric acid, and the etching for the formation of the spacer consists of RIE and wet etching that uses diluted hydrofluoric acid.

A second mode of the method of manufacturing a semiconductor device according to this invention includes a process of forming on the surface of a silicon substrate at least an N-type region which will become the collector region of an NPN bipolar transistor, and an element isolation region which partitions at least a region where the base region of the NPN bipolar transistor, a process of forming selectively a silicon oxide film on the surface of the region of the N-type region a P-type link base region and a P-type intrinsic base region of the NPN bipolar transistor, a process of forming a P+-type polycrystalline silicon film which covers at least a region where the base region is to be formed, and forming by a CVD method a silicon nitride film which covers at least the top face of the P+-type polycrystalline silicon film, a process of forming, after anisotropically etching in sequence the silicon nitride film and the P+-type polycrystalline silicon film on a region where an N+-type emitter region of the NPN bipolar transistor is to be formed, an emitter opening and a base lead-out electrode consisting of the P+-type polycrystalline silicon film by etching of buffered hydrofluoric acid the silicon nitride film on the region where a P-type link base region and a P-type intrinsic base region of the NPN bipolar transistor, and forming between the base lead-out electrode and the N-type region a gap having the form that surrounds the circumference of the emitter opening, a process of forming allover the surface a BSG film containing boron at a concentration lower than that of the P+-type polycrystalline silicon film in the shape of burying the gap, a process of forming by a first heat treatment a P+-type extrinsic base region in self-alignment with the base lead-out electrode on the region where the base region is to be formed, and forming a P-type intrinsic base region in self-alignment with the BSG film on the region on a region including the formation region of a P-type link base region where a base region is to be formed, a process of forming a spacer consisting of the BSG film and having the form of filling in the gap, on the side face of the emitter opening by means of etching including anisotropic etching, a process of forming an emitter electrode consisting of an N+-type polycrystalline silicon film in the form of burying the emitter opening, and a process of forming by a second heat treatment a P-type link base region in self-alignment with the spacer and an N+-type emitter region in self-alignment with the emitter lead-out electrode, in the P-type intrinsic base region.

Preferably, the CVD method for forming the silicon nitride film is performed at a high temperature, and the etching for forming the spacer consists of RIE and wet etching that uses diluted hydrofluoric acid.

Preferably, the process of forming the BSG film containing boron at a concentration lower than that of the P+-type polycrystalline silicon film, allover the surface in the form of filling in the gap, consists of a process of forming allover the surface a first BSG film containing boron at a lower concentration than that of the P+-type polycrystalline silicon film, a process of residually forming by isotropic etching the first BSG film only in the gap, and a process of forming allover the surface a second BSG film containing boron at a lower concentration than that of the first BSG film, and the process of forming the spacer consists of a process of etching including anisotropic etching of the second BSG film. Further, it is preferable that the CVD method for forming the silicon nitride film is performed at a high temperature, the isotropic etching of the first BSG film is carried out using at least buffered hydrofluoric acid, and the etching including anisotropic etching of the second BSG film for forming the spacer consists of RIE and wet etching that uses diluted hydrofluoric acid.

In the method of manufacturing a semiconductor device in accordance with this invention, a BSG film or a silicon oxide film is formed on the region of formation of the P-type link base region and the region of formation of the P-type intrinsic base region, in the region where the base region is formed, and the P+-type polycrystalline silicon film and the silicon nitride film are formed on the region which covers the region where the base region including the BSG film or the silicon oxide film is formed. Therefore, the N-type region which becomes the collector region and the P+-type polycrystalline silicon film in the region where the emitter opening is formed, are not brought into direct contact with each other. As a result, in the etching for the formation of the emitter opening, roughening of the surface of the N-type region where the emitter opening is to be formed due to removal of the surface by etching can be avoided, and the deterioration of the breakdown voltage of the emitter region, increase of the leakage current, fluctuation of the current amplification factor ($h_{FE}$) or the like can be prevented.

Moreover, in the method of manufacturing a semiconductor device in accordance with this invention, for the reasons that the spacer consisting of the BSG film is formed on the side face of the emitter opening and that the process of residually forming the BSG film or the process of replacing the BSG film by the silicon nitride film is included for the region where the P-type link base region is formed, it becomes easy to form a P-type link base region having a boron concentration higher than the boron concentration of the P-type intrinsic base region and lower than the boron concentration of the P+-type extrinsic base region. Because of this, the bipolar transistor according to this invention has low parasitic base resistance.

As a result, according to this invention it becomes easy to manufacture an NPN bipolar transistor with SST structure having high operating speed and a semiconductor device which includes such a bipolar transistor.

BRIEF DESCRIPTION OF THE DRAWINGS

The above-mentioned and other objects, features and advantages of this invention will become more apparent by reference to the following detailed description of the invention taken in conjunction with the accompanying drawings, wherein.

DETAILED DESCRIPTION OF THE PREFERRED EMBODIMENTS

Before proceeding to the description of this invention, an explanation of the conventional method of manufacturing a semiconductor device by reference to drawings is in order.

Figure 1A:
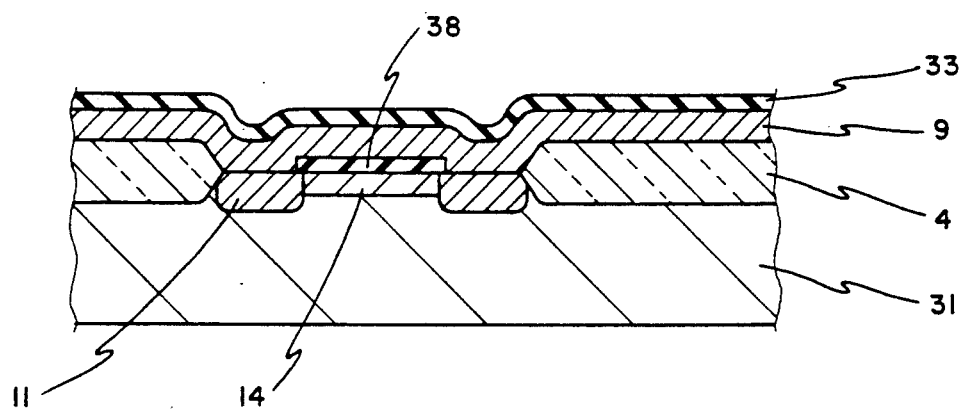
FIGS. 1A to 1C are schematic sectional views showing the manufacturing process of a bipolar transistor of NPN type of the conventional SST structure.
Figure 1B:
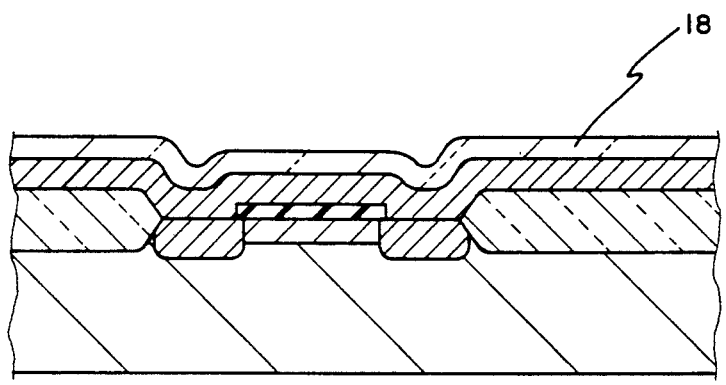
Figure 1C:
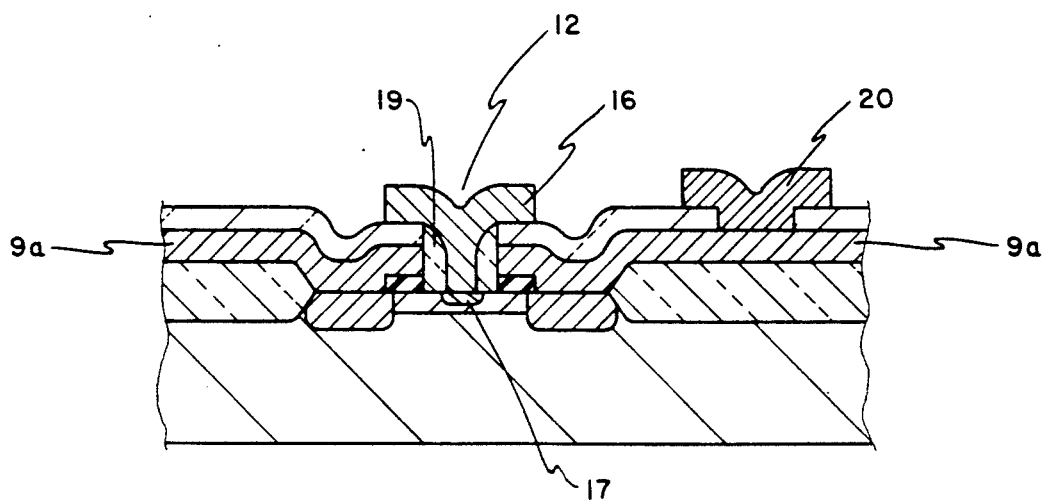

In a bipolar transistor having the SST structure aimed at increasing the operating speed of a vertical bipolar transistor, high speed is realized by reducing the parasitic base resistance and the parasitic base capacitance. In order to further increase the operating speed of a bipolar transistor with this structure, two technical issues have to be resolved. A first issue is that it is difficult to further reduce the parasitic base resistance because of the fact that there exists a high resistance P-type intrinsic base region between an N+-type emitter region and a P+-type extrinsic base region. A second issue is that deterioration of the breakdown voltage of the emitter region, increase in the leakage current, fluctuation of the current amplification factor ($h_{FE}$), or the like, for example, are liable to be caused due to etching of a P+-type polycrystalline silicon film for the purpose of formation of the emitter opening. A method for settling the second issue is disclosed in the aforementioned Japanese Patent Application Laid-Open No. 64-64258. Referring to FIGS. 1A to 1C showing the conventional method of manufacturing the bipolar transistor disclosed in the publication is as follows.

First, a field oxide film 4 is formed selectively on the surface of an N-type silicon substrate 31 excluding a region where at least a base region consisting of a P+-type extrinsic base region and a P-type intrinsic base region is to be formed. Next, a mask material consisting of a first silicon oxide film 38 with thickness of about 50 nm is formed on the surface of the region of the N-type silicon substrate 31 where the P-type intrinsic base region is to be formed. Next, an undoped polycrystalline silicon film and a solid phase diffused material consisting of, for example, a BSG film 33 (with boron concentration of about $1 \times 10^{20}$ cm$^{-3}$) are formed allover the surface in sequence. Subsequently, a P+-type extrinsic base region (with junction depth of about 0.5 μm) 11 and a P-type intrinsic base region (with junction depth of about 0.3 μm) 14 are formed by an annealing at 950° C. for 30 min. The undoped polycrystalline silicon film is converted to a P+-type polycrystalline silicon film 9 is a result of the annealing [FIG. 1A]. Next, after removal of the BSG film 33 an interlayer insulating film 18 consisting of a second silicon oxide film is formed allover the surface [FIG. 1B].

Next, the interlayer insulating film 18 and the P+-type polycrystalline silicon film 9 are etched in succession by a two-stage RIE using photoresist films to form a base lead-out electrode 9a consisting of the P+-type polycrystalline film and a window in a region where an emitter opening is to be formed. In the etching of the P+-type polycrystalline silicon film 9, the silicon oxide film 38 functions as an etching stopper protecting the surface of the N-type silicon substrate 31 from being exposed to the etching, so that the generation of defects, contamination, damages or the like in this part can be avoided.

Next, a third silicon oxide film is deposited allover the surface. Following that, the silicon film is etched back by RIE, and an emitter opening 12 having a silicon oxide film 19 as the spacer is formed. Next, an emitter lead-out electrode 16 consisting of an N+-type polycrystalline silicon film is formed, and an N+-type emitter region 17 is formed by heat treatment. Then, an opening is formed in the interlayer insulating film 18, and a base electrode 20 is formed [FIG. 1C].

By virtue of this manufacturing method, the aforementioned second issue is settled. In this manufacturing method the P-type intrinsic base region 14 is formed by boron atoms from the BSG film 33 which passed through the polycrystalline silicon film and the silicon oxide film 38. Accordingly, when the impurity concentration of the P-type intrinsic base region is high, the parasitic base resistance is reduced and the aforementioned first issue can also be settled. However, the base width becomes large (that is, the junction depth of the P-type intrinsic base region 14 becomes large), the cut-off frequency ($f_T$) cannot be made high, and the method is not suited for increasing the operating speed. On the other hand, when the impurity concentration of the P-type intrinsic base region is low, the parasitic base resistance cannot be reduced, and the first issue cannot be settled.

Next, referring to the drawings, this invention will be described.

Figure 2A:
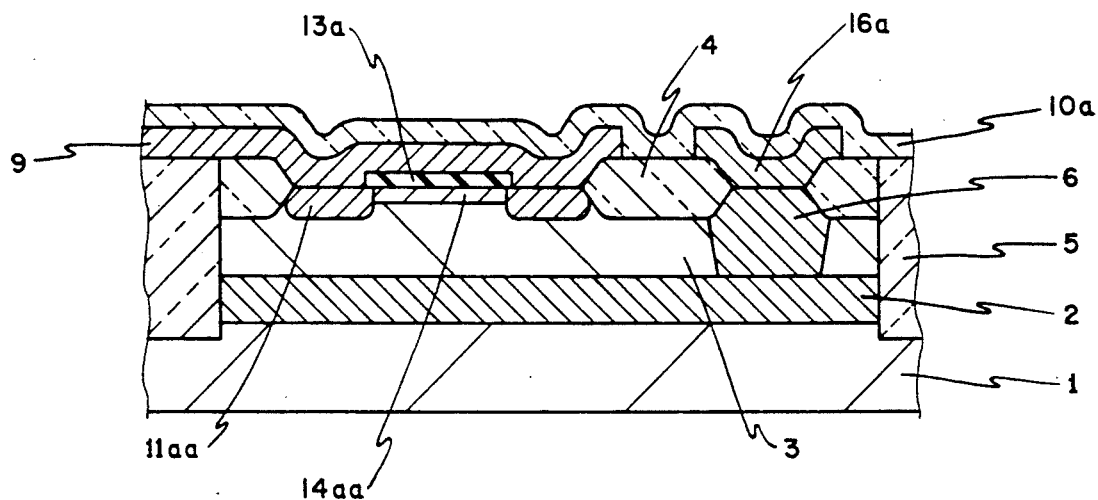
FIGS. 2A to 2C are schematic sectional views showing a first embodiment of the manufacturing method of the invention.
Figure 2B:
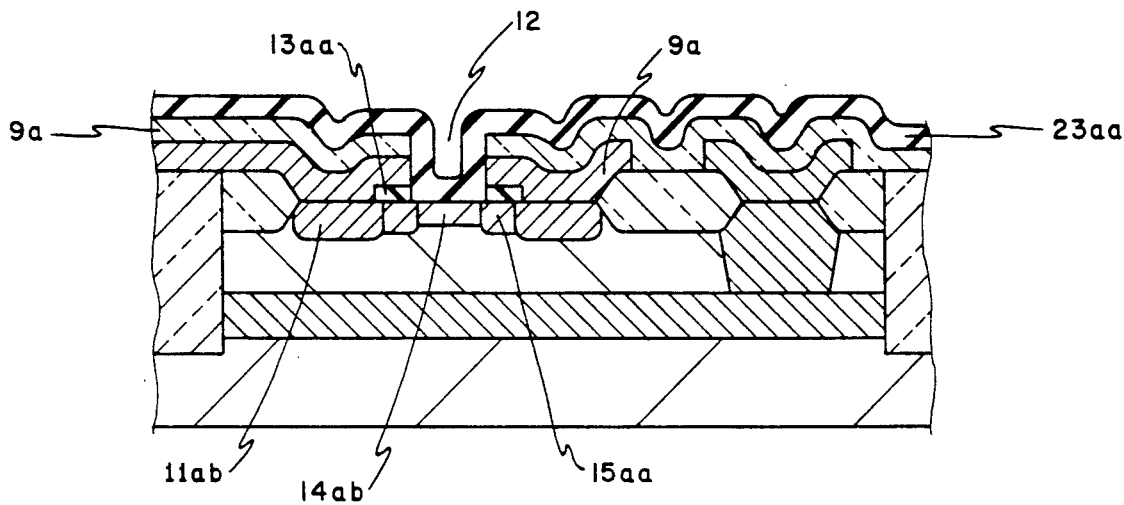
Figure 2C:
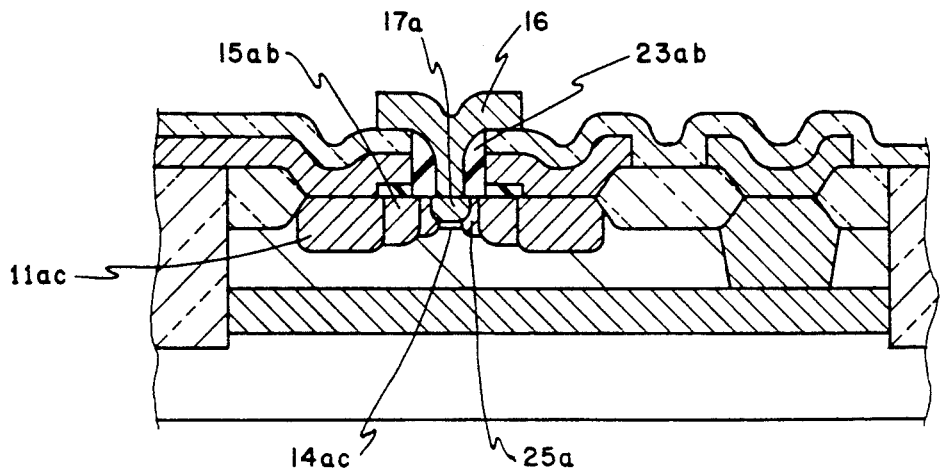

Referring to FIGS. 2A to 2C, the first embodiment of the manufacturing method according to this invention will be described below.

First, an N+-type buried layer 2 is formed on the surface of a region of a P-type silicon substrate 1 where an NPN bipolar transistor is to be formed. A silicon epitaxial layer with thickness of 1.0 to 1.5 μm is formed allover the surface. At this time, the part of the epitaxial layer that covers the N+-type buried layer 2 becomes on N-type epitaxial layer 3. Next, a local oxidation type field oxide film 4 is formed. By the field oxide film 4, a region where the base region is to be formed and a region where the collector region is to be formed are partitioned. Subsequently, a trench isolation region 5 which penetrates the field oxide film 4, the N-type epitaxial layer 3 and the N+-type buried layer 2 and reaches the P-type silicon substrate 1 is formed in the periphery of the region formed by the collector region. In the trench isolation region 5 there is buried an insulating film. The formation of the device isolation region of this bipolar transistor is completed by the formation of the field oxide film 4 and the trench isolation region. Next, an N+-type collector plug region 6 that reaches the N+-type buried region 2 is formed by ion implantation or the like. With the formation of the N+-type collector plug region 6, the formation of the collector region consisting of the N+-type buried layer 2, the N-type epitaxial layer 3 and the N+-type collector plug region 6 is completed.

Next, a thin silicon oxide film (not shown) is formed by thermal oxidation on the surface of the N-type epitaxial layer 3 and the N+-type collector plug region 6, and the silicon oxide film alone on the surface of the N-type epitaxial layer 3 is selectively removed. Next, on the region of the N-type epitaxial layer 3 where a P-type intrinsic base and a P-type link base region are to be formed, a first BSG film 13a with thickness of about 100 nm is selectively formed. The formation method of the first BSG film 13a is a CVD method at 600° to 650° C. which uses tetraethylorthosilicate (TEOS; Si(OC$_2$H$_5$)$_4$), oxygen (O$_2$) and trimethylborate (TMB; B(OCH$_3$)$_3$). The boron concentration of the BSG film 13a is 8 to 10 mol %.

Next, the silicon oxide film left on the surface of the N+-type collector plug region 6 is removed, and an undoped polycrystalline silicon film with thickness of about 200 nm is deposited allover the surface. Following that, the undoped polycrystalline silicon film is patterned to the part that covers the surface of the N-type epitaxial layer 3 and the part that covers the surface of the N+-type collector plug region 6. Next, a P+-type polycrystalline silicon film 9 and a collector lead-out electrode 16 consisting of an N+-type polycrystalline silicon film are formed by ion implanting boron of about $1 \times 10^{16}$ cm$^{-2}$ and phosphorus of about $1 \times 10^{16}$ cm$^{-2}$ to the undoped polycrystalline silicon film which covers the surface of the N-type epitaxial layer 3 and the undoped polycrystalline silicon film which covers the surface of the N+-type collector plug region 6, respectively.

Next, a silicon nitride film 10a with thickness of about 150 nm is formed allover the surface by a CVD method at 750° to 850° C. that uses silane ($SH_4$) and ammonia ($NH_3$). The silicon nitride film may be formed by plasma CVD method. However, in order to perfectly isolate by insulation an emitter lead-out electrode consisting of the N+-type polycrystalline silicon film from a base lead-out electrode consisting of the P+-type polycrystalline silicon film 9 that are to be formed in the later process, it is desirable to have a compact film having high resistance to etching for the silicon nitride film to be used here. Since this silicon nitride film 10a is formed by a high temperature CVD method, a P+-type extrinsic base region 11aa and a P-type intrinsic base region 14aa are formed on the surface of the N-type epitaxial layer 3 by thermal diffusion from the P+-type polycrystalline silicon film 9 and thermal diffusion from the BSG film 13a [FIG. 2A]. The junction depths of the P+-type extrinsic base region 11aa and the P-type intrinsic base region 14aa are respectively very small.

Next, by an etching including anisotropic etching which uses a photoresist film (not shown) as the mask, the silicon nitride film 10a, the P+-type polycrystalline silicon film 9 and the BSG film 13a, which exist over the region where an emitter region is to be formed, are removed sequentially, and an emitter opening 12 is formed. As a result of this etching, a base lead-out electrode 9a consisting of the P+-type polycrystalline silicon film is formed, and a BSG film 13aa having the form of surrounding the circumference of the emitter opening 12 is residually formed. The breadth of the BSG film 13aa is about 0.3 to 0.6 μm. The emitter opening 12 has a rectangular shape whose short side is 0.4 to 1.0 μm. Since the BSG film 13a is interposed between the P-type intrinsic base region 14aa and the P+-type polycrystalline silicon film 9 in the etching for the formation of the emitter opening 12, roughening of the surface due to removal of the surface of the P-type intrinsic base region 14aa where the emitter region is to be formed, by etching, can be avoided in the same as in the manufacturing method disclosed in the aforementioned Japanese Patent Application Laid-Open No. 64-64258.

The etching for the formation of the emitter opening 12 will be described in more detail. The etching of the silicon nitride film 10a is RIE which employs the gas of a fluorocarbon, and the etching of the P+-type polycrystalline silicon film 9 is RIE which employs hydrogen bromide (HBr) and chlorine ($Cl_2$) as the source gas. The etching of the BSG film 13a suffices if it is RIE which employs trifluoromethane ($CHF_3$) and oxygen ($O_2$). However, it is preferable to remove about 90 nm-thick portion of the BSG film 13a by the above-mentioned RIE, and to remove about 10 nm-thick portion that remains of the BSG film 13a by wet etching that uses diluted hydrofluoric acid (of, for example, $HF:H_2O=1:50$). With this arrangement, roughening of the surface of the P-type intrinsic base region 14aa where the emitter region is to be formed can be avoided as mentioned above, the surface of the P-type intrinsic base region will not be exposed to RIE, and the generation of defects, contamination, damages or the like due to RIE can be avoided.

Next, a BSG film 23aa with thickness of 100 nm and boron concentration of 4 to 6 mol % is formed allover the surface by the same method as in the formation of the first BSG film 13a. Subsequently, a first heat treatment is given in a dry oxygen ($O_2$) atmosphere at 850° C. for 20 min, or in a nitrogen ($N_2$) atmosphere at 900° C. for 20 min. The P+-type extrinsic base region 11aa is converted to a P+-type extrinsic base region 11ab by the diffusion of boron from the base lead-out electrode 9a. In addition, a first P-type link base region 15aa is formed in the P-type intrinsic base region 14aa by the diffusion of boron from the BSG film 13aa. Further, the P-type intrinsic base region 14aa in the region of formation of the emitter region is converted to a P-type intrinsic base region 14ab by the diffusion of boron from the second BSG film 23aa [FIG. 2B]. It is to be noted that the BSG film 23aa will not reflow in the heat treatment.

Next, a BSG film 23ab which becomes the spacer is residually formed by etching-back of the second BSG film 23aa by the same RIE used for the etching of the BSG film 13a, and the surface of the P-type intrinsic base region 14ab in the region of formation of the emitter region is exposed. In this case, for the same reason (to avoid damages or the like due to RIE) as described in the above, the etching-back of the BSG film 23aa by RIE may be limited to the portion of thickness of about 90 nm, and remove the remaining portion of the BSG film 23aa with thickness of about 10 nm by the use of diluted hydrofluoric acid. Next, an emitter lead-out electrode 16 consisting of an N+-type polycrystalline silicon film is formed.

Subsequently, an N+-type emitter region 17a with junction depth of about 0.1 μm is formed by a second heat treatment consisting of lamp annealing in a nitrogen ($N_2$) atmosphere at 1050° C. for 20 sec. As a result of this heat treatment, the P+-type extrinsic base region 11ab becomes a P+-type extrinsic base region 11ac with junction depth of about 0.35 μm. The first P-type link base region 15aa becomes a first P-type link base region 15ab with junction depth of about 0.32 μm. Moreover, the P-type intrinsic base region 14ab is converted to a P-type intrinsic base region 14ac with junction depth of about 0.25 μm. Furthermore, a P-type link base region 25a with junction depth of about 28 μm is formed between the first P-type link base region 15ab and the P-type intrinsic base region 14ac by the diffusion of boron from the BSG film 23ab due to the heat treatment. The boron concentration of these P-type regions is increasing in the order of the P-type intrinsic base region 14ac, the second P-type link base region 25a, the first P-type link base region 15ab and the P+-type extrinsic base region 11ac. The base width becomes on the order of 15 nm [FIG. 2C].

Following that, an interlayer insulating film is formed allover the surface according to a well-known method. Further, a collector electrode, a base electrode and an emitter electrode consisting of a metallic film, and the like are formed, completing the desired NPN bipolar transistor having the SST structure.

The above-mentioned first embodiment of the manufacturing method has an effect of reducing the parasitic base resistance due to the formation of the first P-type link base region 15ab and the second P-type link base region 25a, in addition to the advantages of the manufacturing method disclosed in the aforementioned Japanese Patent Application Laid-Open No. 64-64285 relating to the formation of the emitter opening. Moreover, according to this embodiment, insulating isolation is effected by the silicon nitride film 10a and the BSG film 23ab that lie between the emitter lead-out electrode 16 and the base lead-out electrode 9a. In particular, due to the fact that the top face of the base lead-out electrode 9a is covered with the silicon nitride film 10a the defective insulation between the two electrodes that depends on the manufacturing method can perfectly be prevented.

Moreover, in the above-mentioned embodiment, the base lead-out electrode 16a was formed in the early stage, but the base lead-out electrode 16a can be done without. In this case, the first BSG film 13a is formed in the state where a thin silicon oxide film is left on the surface of the N+-type collector plug region 6. Next, a P+-type polycrystalline silicon film and a silicon nitride film are formed allover the surface, and these P+-type polycrystalline film and silicon nitride film are residually formed only in the part where the base lead-out electrode 9a and the emitter opening 12 are formed. The manufacturing method thereafter is similar to the case of the first embodiment.

The first embodiment in the above has been described by reference to the manufacturing method only of a bipolar transistor. However, it is obvious that the embodiment is also applicable to a BiMOS or a BiCMOS.

Figure 3A:
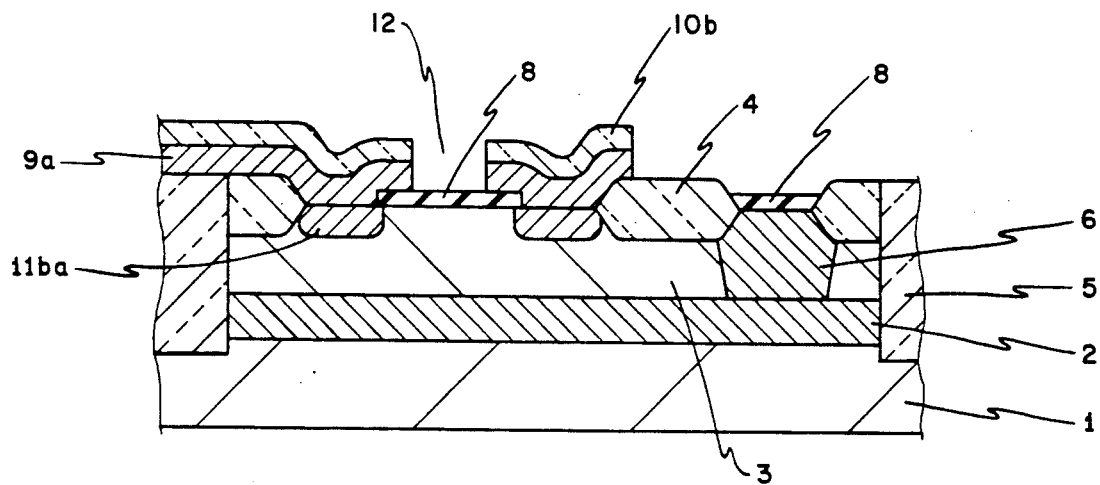
FIGS. 3A to 3C are schematic sectional views showing a second embodiment of the manufacturing method of the invention.
Figure 3B:
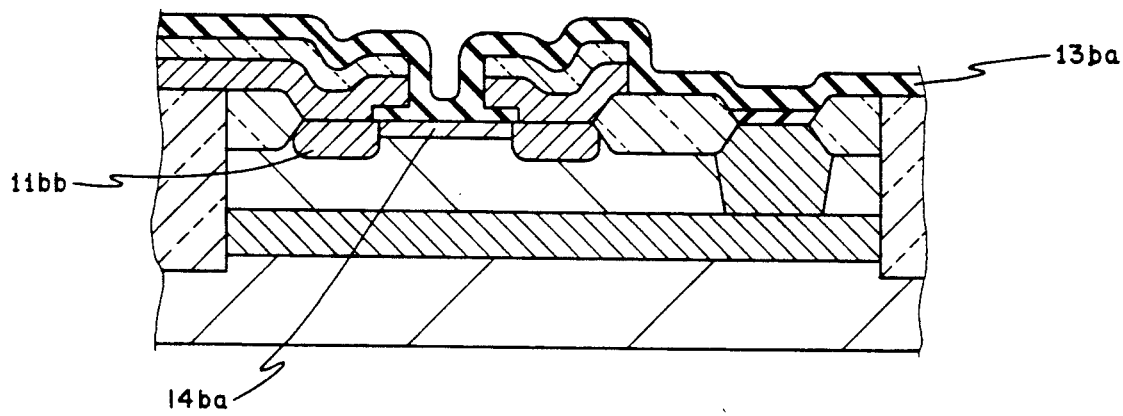
Figure 3C:
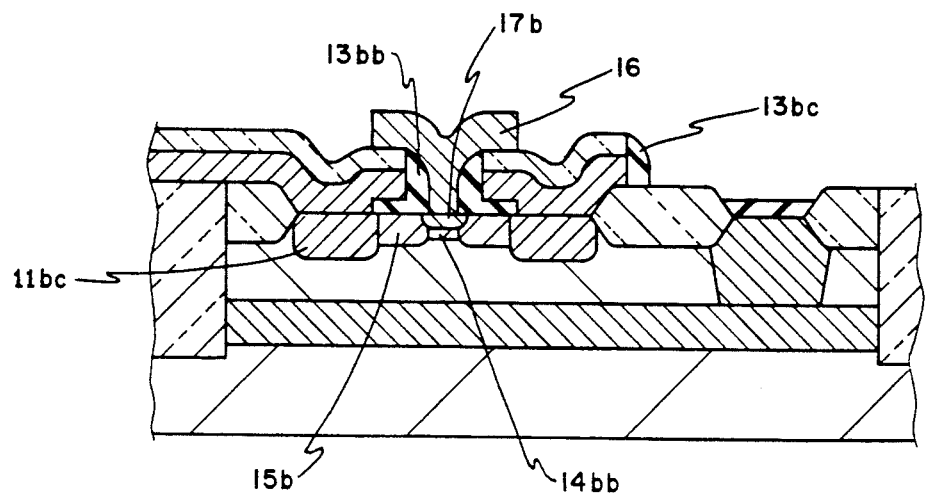

Referring to FIGS. 3A to 3C, the second embodiment of the manufacturing method according to this invention will be described below.

The process up to the formation of the N+-type collector plug region 6 is similar to the case of the first embodiment. Following that, a silicon oxide film 8 with thickness of about 100 nm is formed by thermal oxidation on the surface of the N-type epitaxial layer 3 and the N+-type collector plug region 6. Then, the silicon oxide film 8 only on the region where a P+-type extrinsic base region is to be formed is removed by etching. Next, a 200 nm-thick P+-type polycrystalline silicon film is formed allover the surface, and a 150 nm-thick silicon nitride 10b is formed by a method similar to the first embodiment. At the time of formation of the silicon nitride film 10b a P+-type extrinsic base region 11b with small junction depth is formed in the same way as in the first embodiment. Next, these P+-type polycrystalline silicon film and silicon nitride film 10b are formed residually only in the portions where a base lead-out electrode and an emitter opening are to be formed. Subsequently, the silicon nitride film 10b and the P+-type polycrystalline silicon film in the portion where the emitter opening 12 is to be formed are removed by the same method as in the first embodiment, and the base lead-out electrode 9a is formed [FIG. 3A].

Next, the silicon oxide film 8 on the surface of the N+-type collector plug region 6 is covered with a photoresist film (not shown). Only the silicon oxide film 8 on the surface of the N-type epitaxial layer 3 is removed by wet etching using buffered hydrofluoric acid. By this etching, a gap with breadth of 0.3 to 0.6 μm is formed between the base lead-out electrode 9a and the N-type epitaxial layer 3 so as to surround the bottom of the emitter opening 12. Next, a BSG film 13ba with thickness of about 100 nm and boron concentration of 4 to 6 mol % is formed allover the surface by a method similar to that of the first embodiment. This gap is filled in with the BSG film 13ba. Subsequently, a first heat treatment similar to that in the first embodiment is performed. As a result of this treatment, the P+-type extrinsic base region 11ba is converted to a P+-type extrinsic base region 11bb, and a P-type intrinsic base region 14ba due to boron diffusion from the BSG film 13ba is formed [FIG. 3B].

Following that, the BSG film 13ba is etched allover by an etching including anisotropic etching similar to that in the first embodiment, and a BSG film 13bc and a BSG film 13bb which functions as a spacer are residually formed. In addition, an emitter lead-out electrode 16 consisting of an N+-type polycrystalline silicon film is formed similar to the first embodiment. Following that, a second heat treatment analogous to that of the first embodiment is performed to form an N+-type emitter region 17b with junction depth of about 0.1 μm. Furthermore, as a result of this heat treatment, the P+-type extrinsic base region 11bb is converted to a P+-type extrinsic base region 11bc, the P-type intrinsic base region 14ba is converted to a P-type intrinsic base region 14bb, and a P-type link base region 15b is formed by the boron diffusion from the BSG film 13bb [FIG. 3C]. The junction depth of the P+-type extrinsic base region 11bc is about 0.32 μm. The junction depth, boron concentration, and sheet resistivity of the P-type intrinsic base region are about 0.2 μm, $8 \times 10^{17}$ to $2 \times 10^{18}$ cm$^{-3}$, and 6 to 10 kΩ/□, respectively. The junction depth, boron concentration, and sheet resistivity are about 0.25 μm, $3 \times 10^{18}$ to $5 \times 10^{18}$ cm$^{-3}$, and 3 to 5 kΩ/□, respectively. The base width of this bipolar transistor comes out to be about 0.1 μm.

Subsequently, an interlayer insulating film is formed allover the surface by a well-known method. Further, a collector electrode, a base electrode and an emitter electrode consisting of a metallic film, or the like are formed, completing the desired NPN bipolar transistor of the SST structure.

The second embodiment has a similar effect as the first embodiment except that the sheet resistivity of the P-type link base region 15b is higher compared with that of the corresponding region of the first embodiment. Moreover, in this embodiment, the junction depth of the P-type intrinsic base region 14bb can be made smaller than the junction depth of the P-type intrinsic base region 14ac (first embodiment). Therefore, it is possible to obtain a bipolar transistor having a superior cut-off frequency $f_T$ to that of the first embodiment.

The present applicant fabricated a bipolar transistor based on the manufacturing method disclosed in the aforementioned Japanese Patent Application Laid-Open No. 64-64258. In this case, the thickness of the silicon oxide film 38 was set to be 100 nm, the size of the emitter opening was set to be $1.0 \times 2.2$ μm$^2$, the thickness of the silicon oxide film 19 was set to be 100 nm, and the annealing was carried out in a hydrogen atmosphere (see FIGS. 1A to 1C). Similarly, a bipolar transistor with the size of the emitter opening 12 of $1.0 \times 2.2$ μm$^2$ was manufactured according to the second embodiment. The size of the two kinds of the emitter is $0.8 \times 2.0$ μm$^2$ for each.

Figure 4:
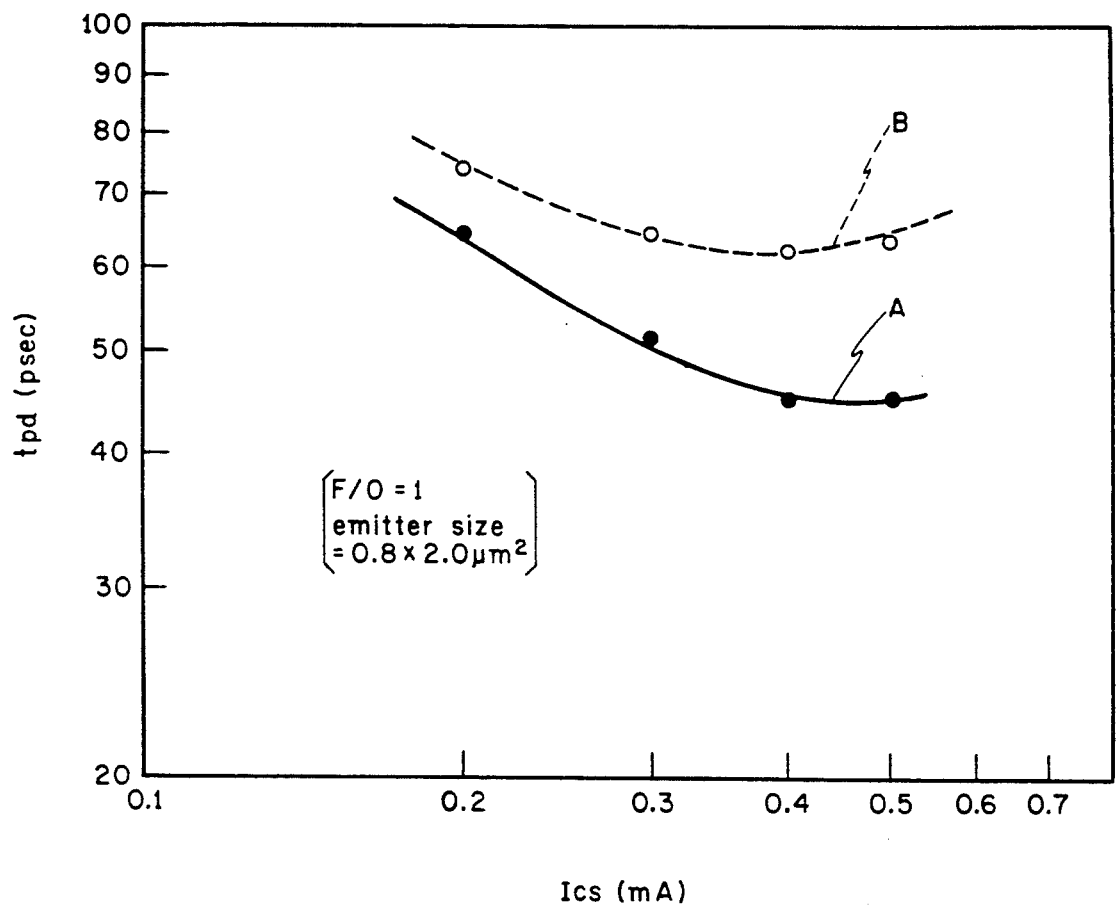
FIG. 4 is a diagram for describing the effect of the second embodiment, which is a graph showing the relation between the gate current ($I_{CS}$) and the delay time ($t_{pd}$) for an ECL gate array with fanout of unity.
Figure 5:
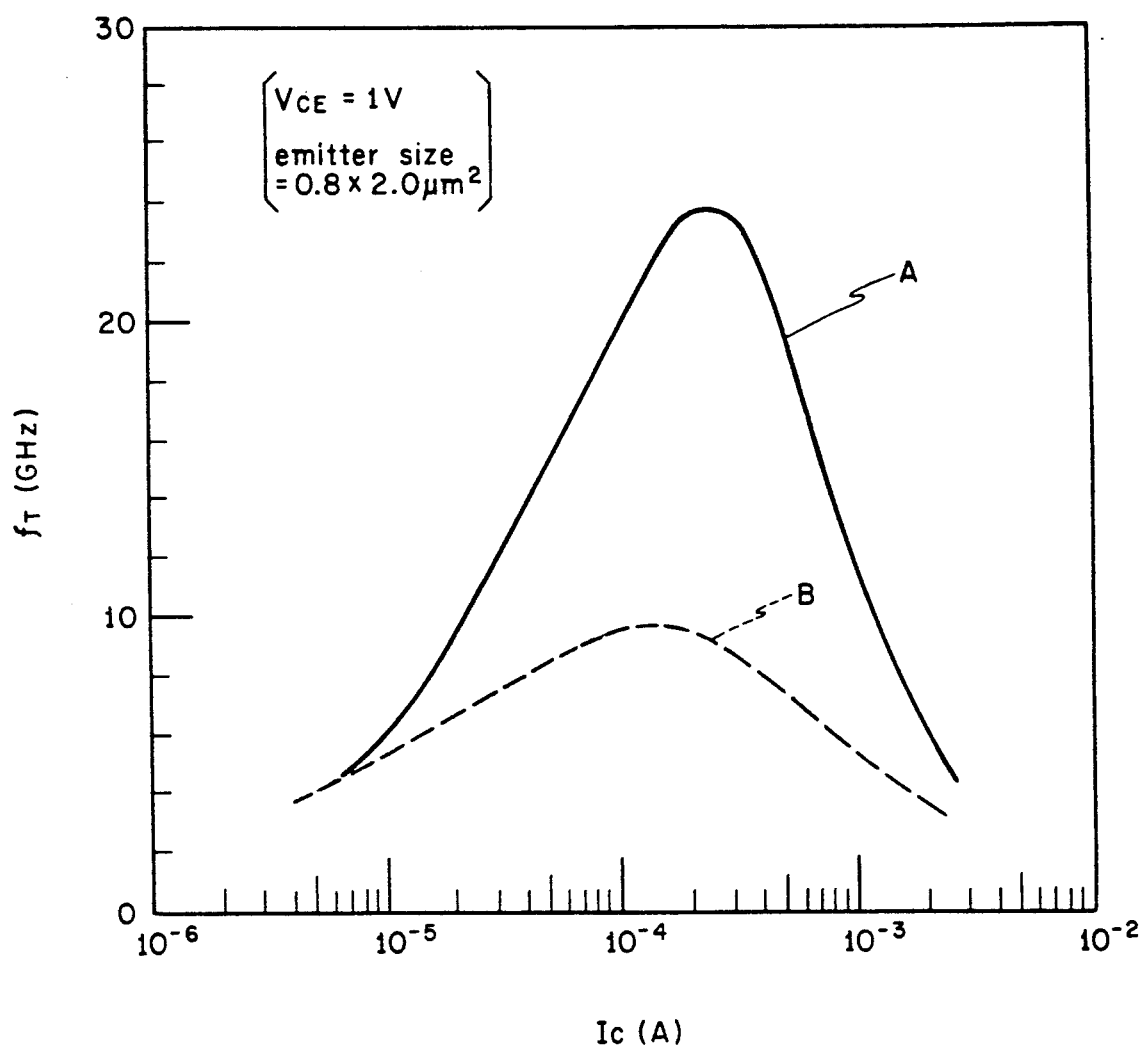
FIG. 5 is a diagram for describing the effect of the second embodiment, which is a graph showing the relation between the collector current ($I_C$) and the cut-off frequency ($f_T$)

Referring to FIG. 4 which is a graph showing the relation between the gate current ($I_{CS}$) and the delay time ($t_{pd}$) in an ECL gate array with fan-out of unity, the value of $t_{pd}$ of the ECL gate array fabricated according to the second embodiment (curve A in the figure) has a value smaller than the value of $t_{pd}$ of the ECL gate array fabricated base on the manufacturing method disclosed in the aforementioned Japanese Patent Application Laid-Open No. 64-64258 (curve B in the figure). Moreover, referring to FIG. 5 which is a graph showing the relation between the collector current ($I_C$) and the cut-off frequency ($f_T$), the value of $f_T$ for the bipolar transistor fabricated according to the second embodiment (curve A in the figure) has a higher value of $f_T$ for the bipolar transistor fabricated based on the manufacturing method disclosed in the aforementioned Japanese Patent Application Laid-Open No. 64-64258 (curve B in the figure).

These results can be considered as in the following. A comparison of the P-type intrinsic base regions shows that the bipolar transistor according to the second embodiment has a smaller junction depth, smaller boron concentration and smaller base breadth. This means that the bipolar transistor according to the second embodiment has a larger value for $f_T$. In the bipolar transistor based on the manufacturing method disclosed in Japanese Patent Application Laid-Open No. 64-64258, a P-type link base region does not exists between the N+-type emitter region 17 and the P+-type extrinsic base region 11, but there exists the P-type intrinsic base region 14 with high boron concentration in the space in between the two regions (that is, the parasitic base resistance is low). Because of this, it is expected that the value of $t_{pd}$ of the ECL gate of this transistor should be smaller than the value of $t_{pd}$ of the ECL gate of the transistor according to the second embodiment. However, the difference between the two values of $f_T$ is too large to be compensated for by the small value of the parasitic base resistance.

Figure 6A:
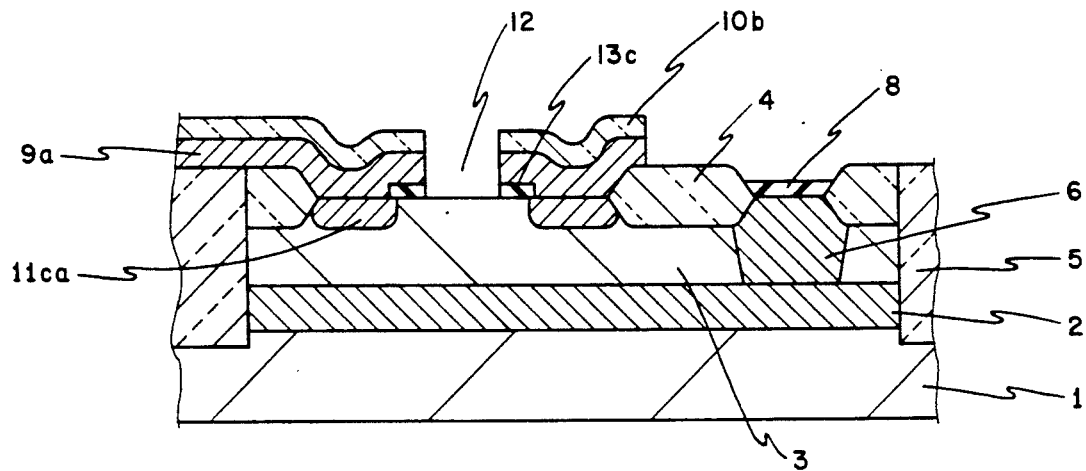
FIGS. 6A to 6C are schematic sectional views showing a third embodiment of the manufacturing method of the invention.
Figure 6B:
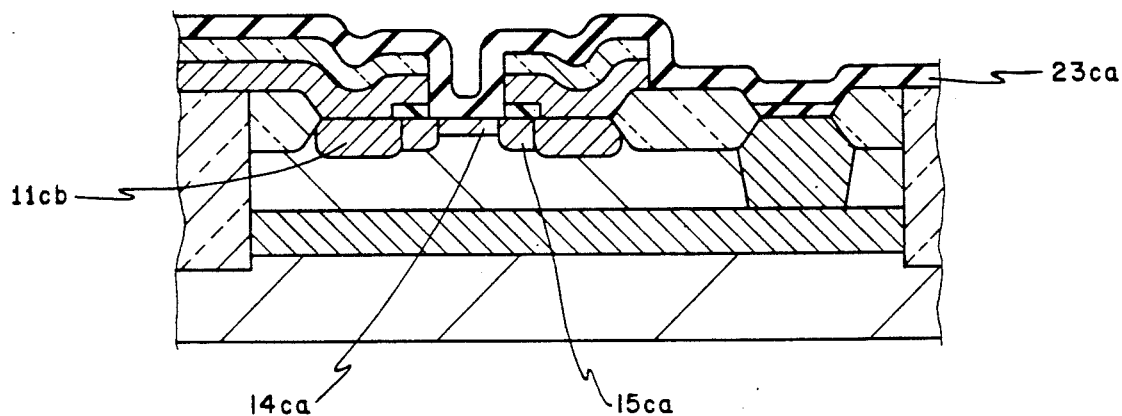
Figure 6C:
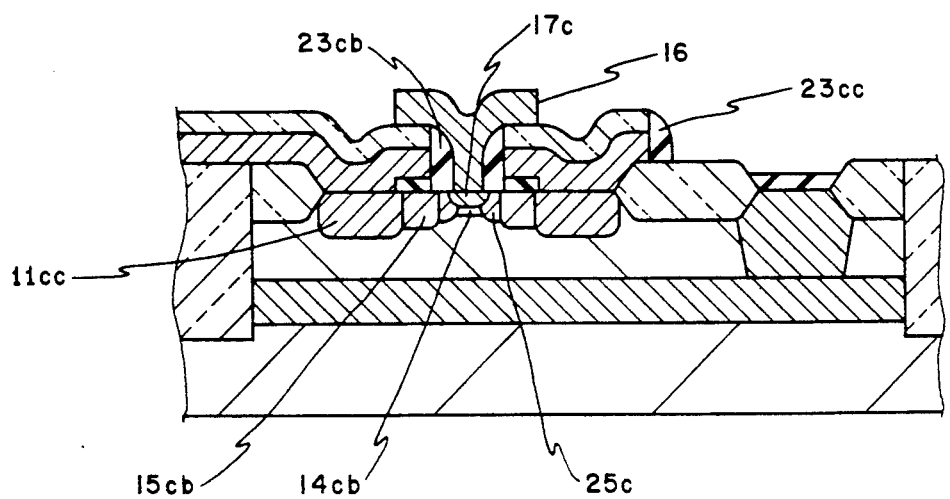

Referring to FIGS. 6A to 6C, the manufacturing method of the third embodiment of this invention will be described below.

Following the formation of the base lead-out electrode 9a, the P+-type extrinsic base region 11ca, the emitter opening 12 and the gap in the same way as in the second embodiment, a first BSG film with thickness of 100 nm and boron concentration of 8 to 10 mol % is formed allover the surface in the same way as in the first embodiment, etched back isotropically, and a BSG film 13c is residually formed only in the gap part [FIG. 6A]. Preferably, the final stage of the isotropic etching is a wet etching that uses diluted hydrofluoric acid.

Next, a second BSG film 23ca with thickness of 100 nm and boron concentration of 4 to 6 mol % is formed by a method similar to that of the second embodiment. Then, a first heat treatment similar to that of the first embodiment is performed. As a result of this treatment, the P+-type extrinsic base region 11ca is converted to a P+-type extrinsic base region 11cb, a first P-type link base region 15ca due to boron diffusion from the BSG film 13c is formed, and a P-type intrinsic base region 14ca due to boron diffusion from the BSG film 23ca is formed [FIG. 6B].

Subsequently, a BSG film 23cc and a BSG film 23cb which functions as the spacer are formed residually by a method similar to that of the first embodiment. In addition, an emitter electrode 16 consisting of an N+-type polycrystalline silicon film is formed in a manner similar to that of the first embodiment. Following that, a second heat treatment similar to that of the first embodiment is performed to form an N+-type emitter region 17c with junction depth of about 0.1 μm. In addition, as a result of this heat treatment, the P+-type extrinsic base region 11cb is converted to a P+-type extrinsic base region 11cc, the P-type intrinsic base region 14ca is converted to a P-type intrinsic base region 14cb, the first P-type link base region 15ca is converted to a first P-type link base region 15cb, and a second P-type link base region 25c is formed by boron diffusion from the BSG film 13cb [FIG. 6C]. The junction depths of the P+-type extrinsic base region 11cc, the first P-type link base region 15cb, the second P-type link base region 25c, and the P-type intrinsic base region 14cb are about 0.35 μm, about 0.28 μm, about 0.25 μm, and about 0.2 μm, respectively. The boron concentration of the first P-type link base region 15cb is about $5 \times 10^{18}$ to $1 \times 10^{19}$ cm$^{-3}$, and its sheet resistivity is about 1 to 3 kΩ/□.

Subsequently, an interlayer insulating film is formed all over the surface by an established method. Further, a collector electrode, a base electrode and an emitter electrode consisting of a metallic film, and the like are formed, completing the desired NPN bipolar transistor with the SST structure.

The third embodiment possesses the same effect as the second embodiment has. Moreover, this embodiment has an effect of reducing the parasitic base resistance to a value comparable to the parasitic base resistance of the first embodiment due to the presence of the first P-type link base region 15cb.

Although the invention has been described with reference to specific embodiments, this description is not meant to be construed in a limiting sense. Various modifications of the disclosed embodiments, as well as other embodiments of the invention, will become apparent to persons skilled in the art upon reference to the description of the invention. It is therefore contemplated that the appended claims will cover any modifications or embodiments as fall within the scope of the invention.

What is claimed is:

1. A method of manufacturing a semiconductor device comprising the processes of:

forming on the surface of a silicon substrate a device isolation region which partitions at least an N-type region that will become the collector region of an NPN bipolar transistor and at least a region where the base region of the NPN bipolar transistor is to be formed;

forming selectively a first BSG film on the surface of said N-type region in a region where a P-type link base region and a P-type intrinsic base region of the NPN bipolar transistor are to be formed;

forming a P+-type polycrystalline silicon film containing boron at a concentration higher than that of said first BSG film and covers at least said base region and forming a silicon nitride film by a CVD method which covers at least the top face of said P+-type polycrystalline silicon film;

etching sequentially by anisotropic etching said silicon nitride film, said P+-type polycrystalline silicon film and said first BSG film on a region where an N+-type emitter region of the NPN bipolar transistor is to be formed, forming an emitter opening and a base lead-out electrode consisting of the P+-type polycrystalline silicon film, and residually forming said BSG film having a form that surrounds the circumference of said emitter opening;

forming all over the surface a second BSG film containing boron at a concentration lower than that of said first BSG film;

forming by a first heat treatment a P+-type extrinsic base region in self-alignment with said base lead-out electrode, a P-type link base region in self-alignment with said first BSG film and a P-type intrinsic base region is self-alignment with said second BSG film;

forming a spacer consisting of said second BSG film on the side face of said emitter opening by means of etching including anisotropic etching;

forming an emitter lead-out electrode consisting of an N+-type polycrystalline silicon film in the form of burying said emitter opening; and forming by a second heat treatment an N+-type emitter region in self-alignment with said emitter lead-out electrode in said P-type intrinsic base region.

2. A method of manufacturing a semiconductor device as claimed in claim 1, wherein the CVD method for forming said silicon nitride film is carried out at a high temperature.

3. A method of manufacturing a semiconductor device as claimed in claim 1, wherein the etching of said first BSG film in the formation of said emitter opening includes at least wet etching using diluted hydrofluoric acid and the etching for the formation of said spacer consists of RIE and wet etching using diluted hydrofluoric acid.

4. A method of manufacturing a semiconductor device comprising the processes of:

forming on the surface of a silicon substrate an element isolation region which partitions at least an N-type region which will become the collector region of an NPN bipolar transistor and at least a region where the base region of the NPN bipolar transistor is to be formed;

forming selectively a silicon oxide film on the surface of said N-type region in a region where a P-type link base region and a P-type intrinsic base region of the NPN bipolar transistor are to be formed;

forming a P+-type polycrystalline silicon film which covers at least the region where said base region is to be formed and forming a silicon nitride film which covers at least the top face of said P+-type polycrystalline silicon film;

etching anisotropically in sequence said silicon nitride film and said P+-type polycrystalline film on a region where an N+-type emitter region of the NPN bipolar transistor is to be formed, etching by buffered hydrofluoric acid said silicon oxide film on a region where said P-type link base region and said intrinsic base region of the NPN bipolar transistor, forming an emitter opening and a base lead-out electrode consisting of said P+-type polycrystalline silicon film, and forming a gap having the form of surrounding the circumference of the emitter opening between said base lead-out electrode and N-type region;

forming all over the surface a BSG film containing boron at a concentration lower than that of said P+-type polycrystalline silicon film in the form of filling in said gap;

forming by a first heat treatment a P+-type extrinsic base region in self-alignment with said base lead-out electrode in a region where said base region is to be formed and forming a P-type intrinsic base region in self-alignment with said BSG film in a region which includes the region where said P-type link base region is formed in the formation region of said base region;

forming a spacer consisting of said BSG film on the side face of said emitter opening in the form of burying said gap by etching including anisotropic etching;

forming an emitter lead-out electrode consisting of an N+-type polycrystalline silicon film in the form of burying said emitter opening; and forming by a second heat treatment a P-type link base region in self-alignment with said spacer and an N+-type emitter region in self-alignment with said emitter lead-out electrode in said P-type intrinsic base region.

5. A method of manufacturing a semiconductor device as claimed in claim 4, wherein the CVD method for forming said silicon nitride film is carried out at a high temperature.

6. A method of manufacturing a semiconductor device as claimed in claim 4, wherein the etching for forming said spacer consists of RIE and wet etching.

7. A method of manufacturing a semiconductor device as claimed in claim 4, wherein the process of forming the BSG film containing boron at a concentration lower than that of said P+-type polycrystalline silicon film all over the surface in the form to bury said gap consists of a process of forming allover the surface a first BSG film containing boron at a concentration lower than that of said P+-type polycrystalline silicon film, a process of residually forming said first BSG film only in said gap part by isotropic etching, and a process of forming all over the surface a second BSG film containing boron at a concentration lower than that of said first BSG film, and the process of forming said spacer consists of a process which forms the spacer by an etching method including anisotropic etching of said second BSG film.

8. A method of manufacturing a semiconductor device as claimed in claim 7, wherein the CVD method for forming said silicon nitride film is carried out at a high temperature.

9. A method of manufacturing a semiconductor device as claimed in claim 7, wherein the etching of said second BSG film for forming said spacer consists of RIE and wet etching that uses diluted hydrofluoric acid.

10. A method of manufacturing a semiconductor device including steps of:

forming a first insulating film on a major surface of a collector region of a first conductivity type, said first insulating film comprising impurities of a second conductivity type; forming a polycrystalline silicon layer covering a surface of said collector region and said first insulating film, consecutively, said polycrystalline silicon layer comprising impurities of said second conductivity type; forming an opening going through said polycrystalline silicon layer and said first insulating film, consecutively, and to expose said major surface of said collector region; forming a second insulating film at side surface of said opening, said second insulating film comprising impurities of said second conductivity type; forming an intrinsic base region, a link base region and an extrinsic base region in said collector region by diffusing impurities of said second conductivity type from said second insulating film, said first insulating film and said polycrystalline silicon layer, respectively, and forming an emitter region of said first conductivity type in said intrinsic base region.

11. The method of manufacturing a semiconductor device as claimed in claim 10, wherein said step of forming said intrinsic base region, said link base region and said extrinsic base region is performed by an heat treatment.

* * * * *